(12) United States Patent
Yamakawa et al.

(10) Patent No.: US 8,610,165 B2
(45) Date of Patent: Dec. 17, 2013

(54) LED LIGHT MODULE WITH HEAT RELEASING CASING AND GROOVED BACKING TO CONTAIN CONDUCTIVE BONDING FLUIDS

(75) Inventors: Mamoru Yamakawa, Osaka (JP); Jun Takashima, Osaka (JP); Koji Uenoyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 88 days.

(21) Appl. No.: 13/299,295

(22) Filed: Nov. 17, 2011

(65) Prior Publication Data
US 2012/0188763 A1  Jul. 26, 2012

(30) Foreign Application Priority Data
Nov. 17, 2010  (JP) .................................. 2010-257173

(51) Int. Cl.
*H01L 33/64* (2010.01)
(52) U.S. Cl.
USPC .......................................... 257/100; 156/295
(58) Field of Classification Search
USPC ........................... 257/100, E33.075; 156/295
See application file for complete search history.

(56) References Cited

U.S. PATENT DOCUMENTS 5,446,814 A * 8/1995 Kuo et al. ........................ 385/31
2006/0169402 A1* 8/2006 Spencer ........................ 156/295

FOREIGN PATENT DOCUMENTS

JP  10012929 A  *  1/1998
JP  2005-071711  3/2005

OTHER PUBLICATIONS

Machine translation of JP 10012929 A (Jan. 1998).*

* cited by examiner

*Primary Examiner* — Thomas L Dickey
(74) *Attorney, Agent, or Firm* — Waddey Patterson; Mark J. Patterson; Mark A. Pitchford

(57) ABSTRACT

An LED module structure and a light fixture provided with the structure includes a heat releasing casing; an LED package having an LED chip mounted on a base material, a material having both heat conductance and electric insulation property placed between the heat releasing casing and the LED package upon fitting of the LED package to the heat releasing casing, and a plastic fluid or adhesive agent having particles with high heat conductivity. The material has a groove with outside smaller than an outside dimension of the LED package. The groove receives excess plastic fluid or excess adhesive agent on a surface to which the LED package is firmly attached.

11 Claims, 7 Drawing Sheets

LED LIGHT MODULE WITH HEAT RELEASING CASING AND GROOVED BACKING TO CONTAIN CONDUCTIVE BONDING FLUIDS

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application which is hereby incorporated by reference: Japan Patent Application No. 2010-257173, filed Nov. 17, 2010.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates to a structure having an LED package fixed to a heat releasing casing and a light fixture provided with the structure.

Conventionally, a lighting structure includes a metal fitted member fitted to a constructed object, a light control body that controls light emitted from an LED package, a cover body having a base substrate sandwiched between the metal fitted member and the light control body, and a light fixture that incorporates the lighting structure.

One example of a conventional lighting structure is disclosed in Japanese Patent Application No. JPA 2005-71711, in which the structure and the light fixture provided with the structure can release heat from the LED package and can position the base substrate in a predetermined position.

However, as shown in FIG. 13, similar to the structure and the light fixture described in JPA 2005-71711 described above, a structure 150 formed by mounting an LED package 151 on a base material 152 of resin or metal through soldering and fitting them onto a casing 153 is suggested.

Moreover, as shown in FIG. 14, a structure 160 formed by mounting an LED package 163 on a base material 161 on which an LED chip 162 is mounted and fitting them to a casing 165 with, for example, a heat conducting sheet 164 or an adhesive agent is suggested.

However, such conventional structures 150 and 160 have a common problem. In the case where the casings 153 and 165 are formed of metal such as aluminum for the purpose of improving heat release performance, and the base materials 152 and 161 are formed of resin such as glass epoxy, the base materials 152 and 161 have poor heat conductivity and heat is not efficiently transferred to the casings 153 and 165. This increases the temperatures of the LED packages 151 and 163, which results in deterioration in light emission efficiency of the LED packages 151 and 163.

To solve such a conventional problem, application of a base material of metal using a material such as copper or aluminum improves heat release performance of the LED package but deteriorates the voltage resistance because the thickness of the insulation layer of the base material is small.

In such a case, a heat conducting sheet with a high voltage resistance is fitted to a rear surface of the base material. However, this heat conducting sheet is soft itself and thus flexure occurs between a screw-fixed portion and a screw-non-fixed portion, thereby causing deformation of the base material, which raises a long-term reliability problem. In addition, heat conductivity of the heat conducting sheet with high voltage resistance is not high, thus impeding heat conduction in some cases.

For the LED package, low consumed power does not cause a serious problem but as a result of automatic fixation of the LED package with an increase in consumed power, following heat generation of the LED package, extension of the metal material itself occurs due to thermal expansion. A small gap is created between the metal material and a hard material having both thermal conductance and electric insulation properties which impedes heat release due to the thermal insulating effect of air.

Further, even when the extension due to the thermal expansion is minimized following the automatic firm fixation, the small gap is created by, for example, the slight deformation of the metal base material, which impedes the heat release.

A possible solution to such a problem is using a plastic fluid or an adhesive agent having addition of particles with high thermal conductivity in a manner such as to fill the small gap. However, the excess plastic fluid or adhesive agent protrudes from the margins of the LED package, which therefore requires an additional material removal process, resulting in an increase in labor costs.

In addition, the conventional structures 150 and 160 require a large-scale facility such as a special reflow device for soldering to the base materials 152 and 161. Therefore, the conventional structures 150 and 160 have cost disadvantages.

Further, the conventional structures 150 and 160 may experience temperatures' of approximately 260° C. in reflow. Therefore, the conventional lighting structures 150 and 160 may experience quality deterioration as a result of degradation of an initial optical beam of the LED packages 151 and 163 due to heat deterioration of the members forming the LED packages 151 and 163.

BRIEF SUMMARY OF THE INVENTION

In one aspect, a lighting structure is provided that is capable of performing efficient thermal release and also preventing an increase labor costs, providing cost advantages, and also preventing quality deterioration. In one embodiment, the structure is included in a light fixture.

In one embodiment, a lighting structure includes a heat releasing casing, an LED package having an LED chip mounted on a base material, a backing having both heat conductance and electric insulation properties which is placed between the heat releasing casing and the LED package upon fitting of the LED package to the heat releasing casing, and a plastic fluid or adhesive agent having high heat conductivity. A groove in the backing has an outside dimension smaller than an outside dimension of the LED package. The groove is operable to release the excess plastic fluid or the excess adhesive agent on a surface to which the LED package is firmly attached.

In one aspect, the backing also has heat radiation properties.

In one embodiment, the backing is made of a ceramic material.

In another embodiment, the backing is formed of a resin.

In yet another embodiment, the backing is formed of a metal having a surface subjected to an insulation treatment.

In one embodiment, a creeping distance between an electric charging unit of the LED package and the radiating casing is 1.2 mm or more.

In one aspect, a light fixture according to the present invention is loaded with the lighting structure.

In another aspect, in a lighting structure and a light fixture that incorporates the structure, heat is radiated efficiently and an increase in labor costs is prevented, cost advantages are provided, and heat deterioration is prevented.

DETAILED DESCRIPTION OF THE INVENTION

Figure 1:
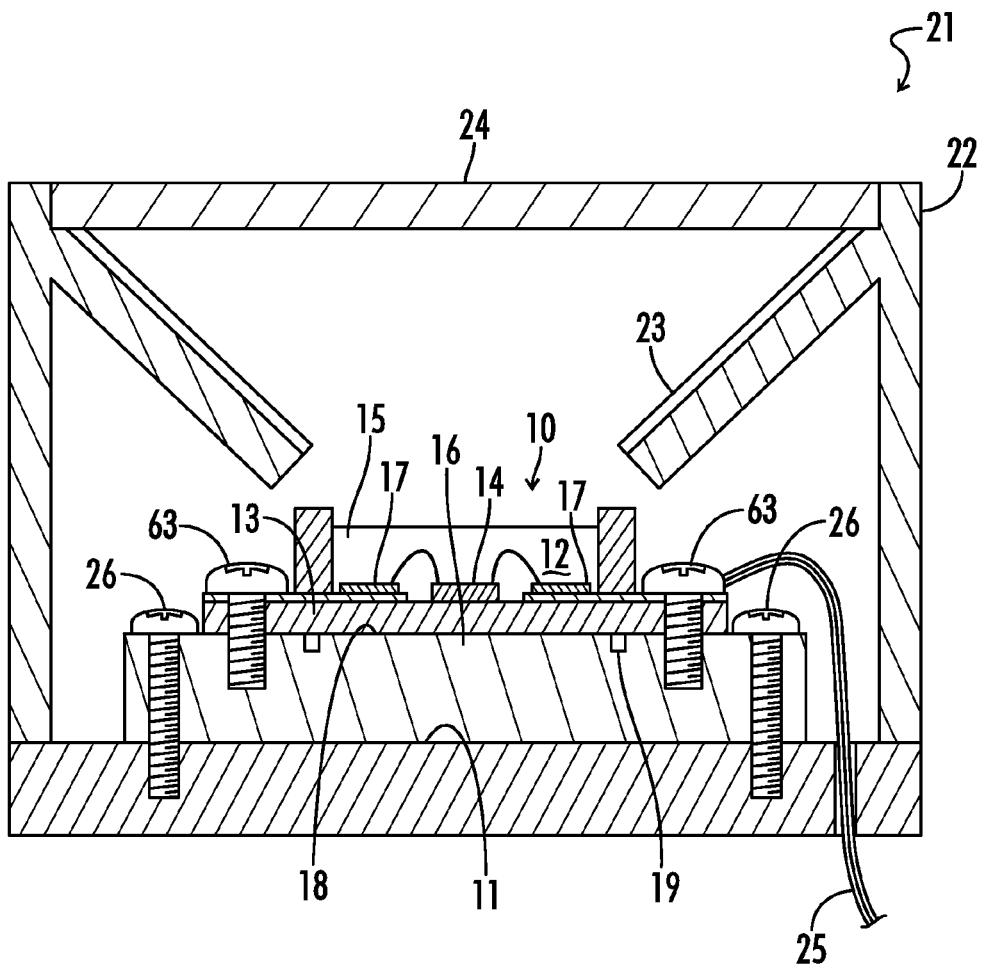
FIG. 1 is a longitudinal sectional view of a light fixture provided with a lighting structure in accordance with a first embodiment of the present invention.

Hereinafter, structures and light fixtures provided respectively with the structures according to a plurality of embodiments of the present invention will be described referring to the drawings.

As shown in FIG. 1, one embodiment of a light fixture 21 that incorporates a lighting structure (LED module) 10 includes a fixture main body 22, a reflector 23 fitted inside of the fixture main body 22; a lens 24 which is, for example, a transparent or milky white resin and which is fitted to a front surface of the fixture main body 22. The structure or module 10 is attached to a heat releasing casing 11. A wire 25 is provided for feeding power to the structure 10. Screws 26 may be used for connecting the structure 10 to the heat releasing casing 11.

Figure 2:
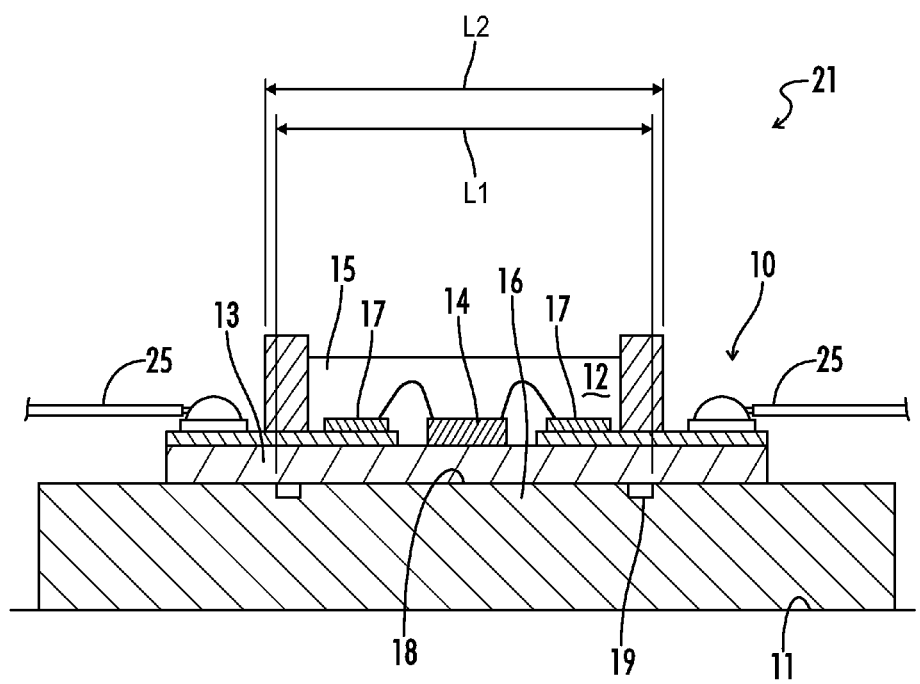
FIG. 2 is a longitudinal sectional view of the lighting structure of the light fixture of FIG. 1.

As shown in FIG. 2, the lighting structure or LED module 10 may include the heat releasing casing 11, an LED package 12 having an LED chip 14 mounted on a base 13 (e.g., a metal base material) and sealed with a sealing material 15. A backing or substrate 16 is positioned between the heat releasing casing 11 and the LED package 12 and has both heat conductance and electrical insulation properties. Electric charging units or LED driver circuitry 17 are configured as circuit patterns in the LED package 12. A plastic fluid 18 is provided having added particles with high heat conductivity and bondability. The wire 25 is electrically connected or soldered to the LED driver circuitry 17.

In some embodiments, in place of the plastic fluid 18, an adhesive agent can be applied.

In some embodiments of the lighting structure 10, a creeping distance between the electric charging unit 17 of the LED package 12 and the heat releasing casing 11 is 1.2 mm or more. Therefore, because the creeping distance between the electric charging unit 17 of the LED package 12 and the heat releasing casing 11 is 1.2 mm or more, sufficient insulation property can be provided on an electric appliance.

The backing 16 has a groove 19 with an outside dimension L1 that is smaller than an outside dimension L2 of the LED package 12. The groove 19 releases excessive plastic fluid 18 on the top surface to which the LED package 12 is closely attached. The groove 19 has a depth and a width previously defined, and is continuously formed into a circular or a rectangular shape.

The backing 16 has high heat radiation property (i.e., a high heat emission property). Therefore, it is capable of heat radiation into air in addition to heat conduction, and therefore can suppress or dissipate heat generated by the LED package 12.

Figure 3:
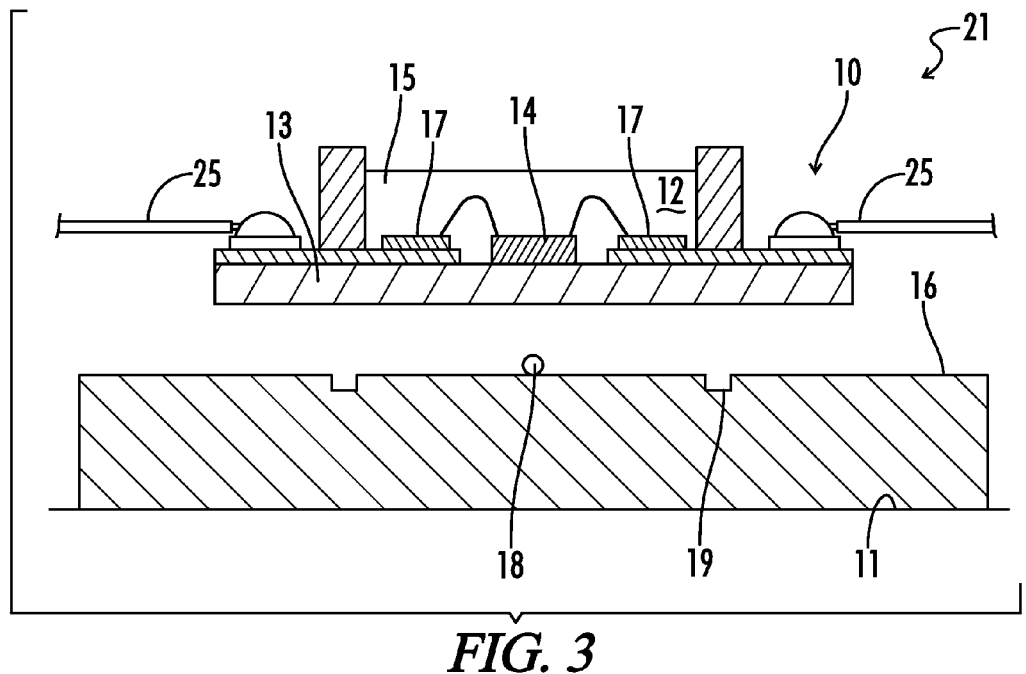
FIG. 3 is a longitudinal sectional view illustrating a process of fitting to a material of an LED package of FIG. 1.

As shown in FIG. 3, upon fitting the LED package 12 to the backing 16, the fluid 18 (e.g., plastic fluid) is sealed between the metal base material 13 and the backing 16. The LED package 12 and the backing 16 are press-fitted, whereby the LED package 12 and the backing 16 are joined together by the plastic fluid 18.

Therefore, the metal base material 13 and the backing 16 are thermally connected to each other via the plastic fluid 18 having the addition of particles with heat conductivity, thus permitting efficient heat release.

When the LED package 12 has been press-fitted to the backing 16, the plastic fluid 18 flows between the metal base material 13 and the backing 16, and the excessive plastic fluid 18 enters into the groove 19.

Therefore, because the outside dimension L1 of the groove 19 in the backing 16 is smaller than the outside dimension L2 of the LED package 12, the excessive plastic fluid 18 enters into the groove 19 and thus does not protrude from the outer margins of the LED package 12. Thus, no additional process steps are needed to remove the excess material.

Such a lighting structure 10 does not require a large-scale facility such as a special reflow device. Therefore, the lighting structure 10 can provide cost advantages. Moreover, such a structure 10 does not have heat problems in reflow. Therefore, the structure 10 can prevent quality deterioration without degrading the initial optical beam of the LED package 12 due to heat deterioration of the members forming the LED package 12.

As described above, with the structure 10 according to the first embodiment, because the outside dimension L1 of the groove 19 of the backing 16 is smaller than the outside dimension L2 of the LED package 12, the excessive plastic fluid 18 enters into the groove 19 and does not protrude from the margins of the LED package 12 when the backing 16 and the LED package 12 are joined. This saves labor costs. Moreover, with the structure 10 shown in FIGS. 1-3, because the metal base material 13 and the backing 16 are thermally connected to each other via the plastic fluid 18, further having the addition of particles with high heat conductivity, efficient heat release can be achieved. Also with the structure 10 of FIGS. 1-3, because no large-scale facility such as the special reflow device is required, cost advantages are provided. Further, with the structure 10 according to the first embodiment, because no heat exposure is provided in reflow, quality deterioration can be prevented without degrading the initial optical beam of the LED package 12 due to the heat deterioration of the members forming the LED package 12. Further, with the structure 10 of the embodiment of FIGS. 1-3, although the fluid (e.g., plastic fluid or adhesive agent) having the added particles with high heat conductivity is typically high in cost, it is sealed into the small gap between the metal base material 13 and the backing 16, and therefore the used amount is very small, which can therefore reduce manufacturing costs. Even application of a plastic fluid (adhesive agent) having particles with relatively low heat conductivity does not have an influence on heat conduction due to presence of the small gap into which the plastic fluid (adhesive agent) is sealed.

Moreover, with the structure 10 of FIGS. 1-3, because the backing 16 has high heat radiation properties, that is, high heat emission properties, heat radiation into the air can be accomplished in addition to heat conduction, which can therefore suppress heat generation of the LED package 12 itself.

With the structure 10 of FIGS. 1-3, because the creeping distance between the electric charging unit 17 of the LED package 12 and the heat releasing casing 11 is 1.2 mm or more, sufficient insulation property can be acquired on an electrical device or appliance.

A lighting structure and a light fixture provided with the structure according to other embodiments of the present invention will also be described.

In embodiments below, components functionally same as overlapping ones of the embodiment of FIGS. 1-3 described above are provided with the same or corresponding numerals in the figures and their descriptions will be simplified or omitted.

Figure 4:
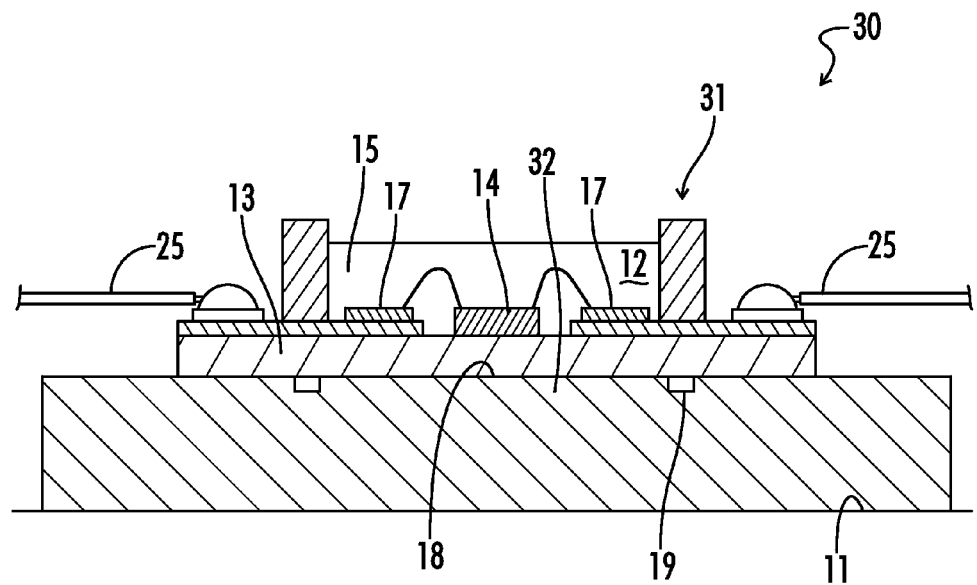
FIG. 4 is a longitudinal sectional view of a lighting structure of a light fixture according to a second embodiment of the present invention.

As shown in FIG. 4, a light fixture 30 incorporated in with a lighting structure or LED module 31 includes a backing 32 formed of aluminum ceramics. With the structure 31 of FIG. 4, the aluminum ceramics backing 32 has high voltage breakdown resistance and does not experience aging degradation attributable to dimensional change, ensuring long-term reliability of the backing 32. Moreover, with the structure 31 of FIG. 4, even when the LED package 12 generates heat, and has a small gap between the metal base material 13 and the backing 32, the metal base 13 and backing 32 are thermally connected to each other via a plastic fluid 18 having particles with high heat conductivity, thus permitting efficient heat release from the LED package 12.

Figure 5:
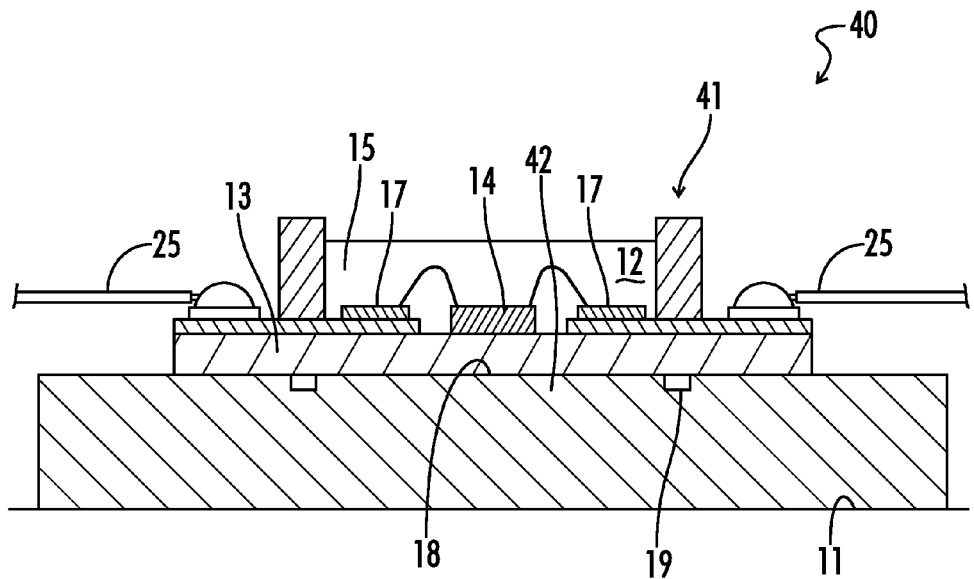
FIG. 5 is a longitudinal sectional view of a lighting structure of a light fixture in accordance with a third embodiment of the present invention.

Referring to FIG. 5, a lighting structure or LED module 41 incorporated in a light fixture 40 includes a backing 42 of resin. With the structure 41 of FIG. 5, because the backing 42, which has both heat conductance and electric insulation properties, is formed of resin, molding can be performed with ease.

Figure 6:
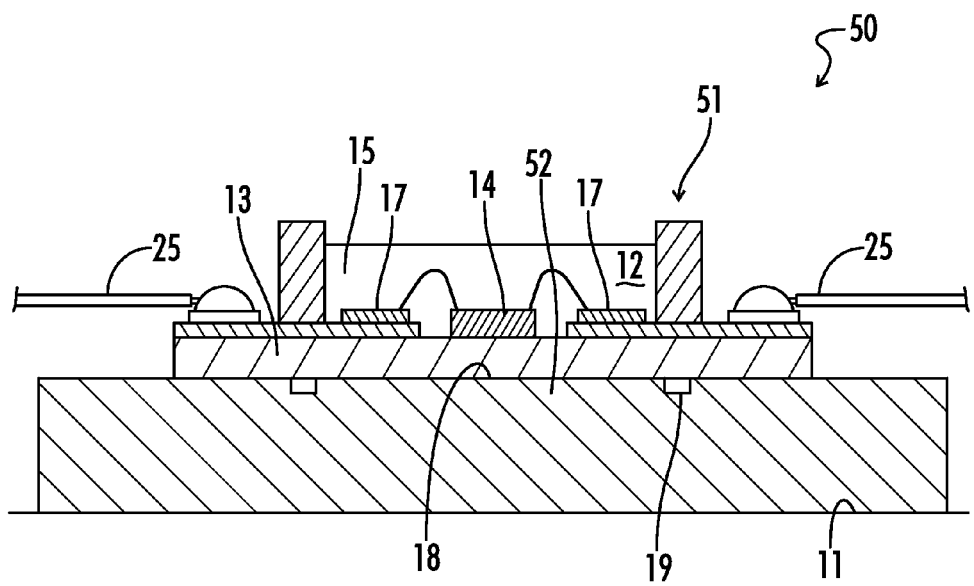
FIG. 6 is a longitudinal sectional view of a lighting structure of a light fixture in accordance with a fourth embodiment of the present invention.

Referring to FIG. 6, a lighting structure or LED module 51 incorporated in a light fixture 50 includes a backing 52 of metal whose surface is subjected to insulation processing such as alumite treatment. With the structure 51 of FIG. 6, the backing 52, which has both heat conductance and electric insulation properties, is formed of metal whose surface is subjected to an insulation treatment, thereby providing cost advantages.

Figure 7:
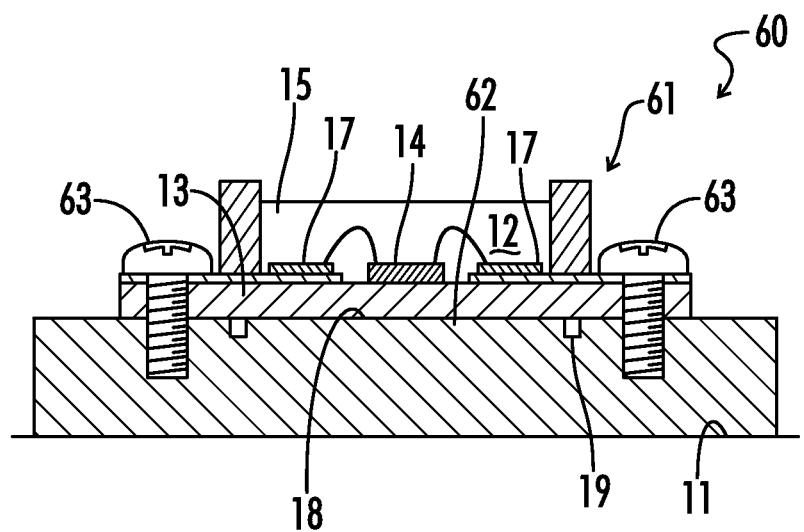
FIG. 7 is a longitudinal sectional view of a lighting structure of a light fixture in accordance with a fifth embodiment of the present invention.

Referring to FIG. 7, the lighting structure or LED module 61 incorporated in a light fixture 60 includes a backing 62 of alumina ceramics. The LED package 12 is fitted to the backing 62 by a screw 63 screwed into the backing 62 through the metal base material 13.

Figure 8:
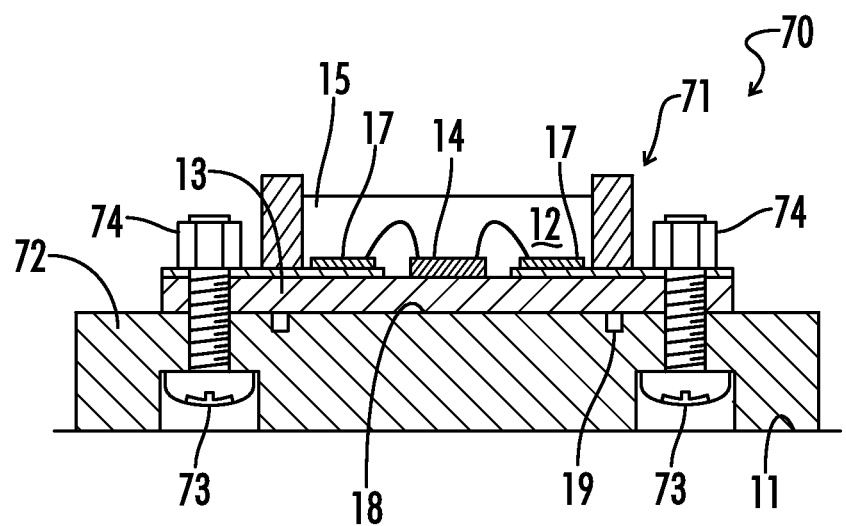
FIG. 8 is a longitudinal sectional view of a lighting structure of a light fixture in accordance with a sixth embodiment of the present invention.

Referring to FIG. 8, a lighting structure or LED module 71 incorporated in a light fixture 70 according to another embodiment of the present invention includes a backing 72 of alumina ceramics. The LED package 12 is fitted to the backing 62 by screwing a nut 74 into a bolt 73 penetrating through the metal base material 13 from the backing 72 side.

Figure 9:
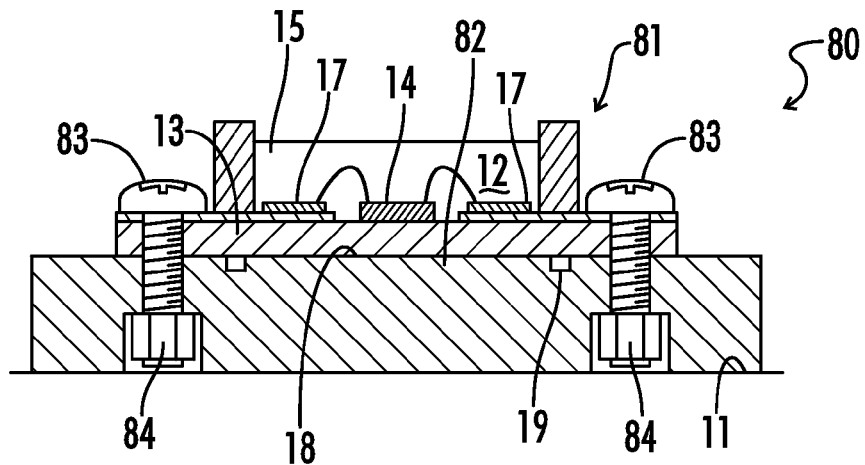
FIG. 9 is a longitudinal sectional view of a lighting structure of a light fixture in accordance with a seventh embodiment of the present invention.

Referring to FIG. 9, a lighting structure or LED module 81 incorporated in a light fixture 80 includes a backing 82 of alumina ceramics. The LED package 12 is fitted to the backing 82 by screwing a nut 84 into a bolt 83 penetrating through the backing 82 from a metal base material 13 side.

Figure 10:
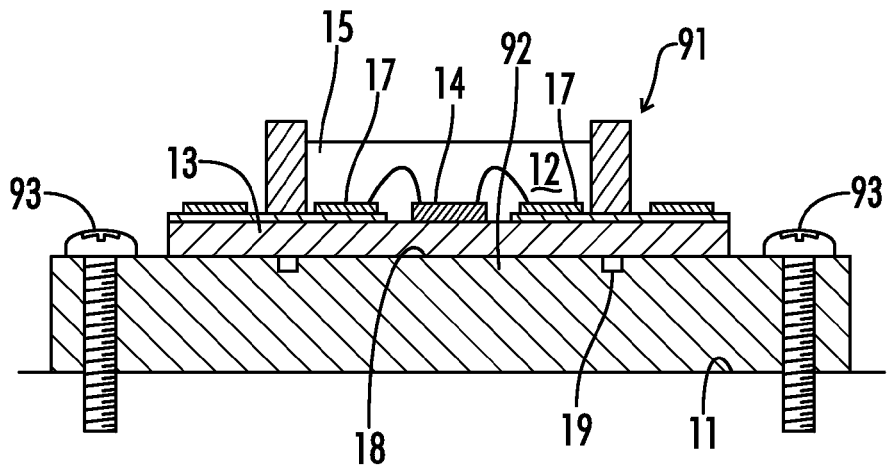
FIG. 10 a lighting structure of a light fixture in accordance with an eighth embodiment of the present invention.

Referring to FIG. 10, a lighting structure or LED module 91 incorporated in a light fixture 90 includes a backing 92 of alumina ceramics. The structure 91 is fitted to the heat releasing casing 11 by screwing a screw 93 into the heat releasing casing 11 in a manner such as to penetrate through the backing 92.

Figure 11:
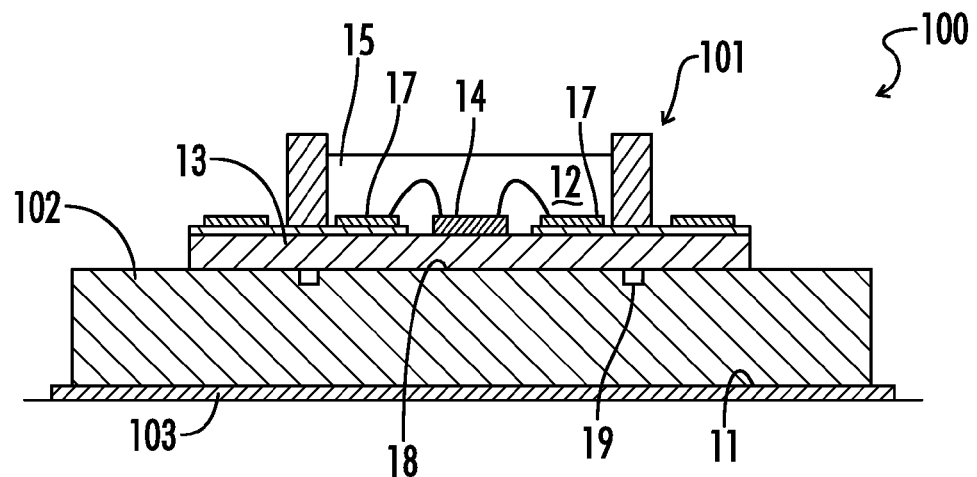
FIG. 11 is a longitudinal sectional view of a lighting structure of a light fixture in accordance with a ninth embodiment of the present invention.

Referring to FIG. 11, a lighting or LED module structure 101 incorporated in a light fixture 100 according to another embodiment of the present invention includes a backing 102 of alumina ceramics. The backing 102 is joined to the heat releasing casing 11 by an adhesive agent 103.

Figure 12:
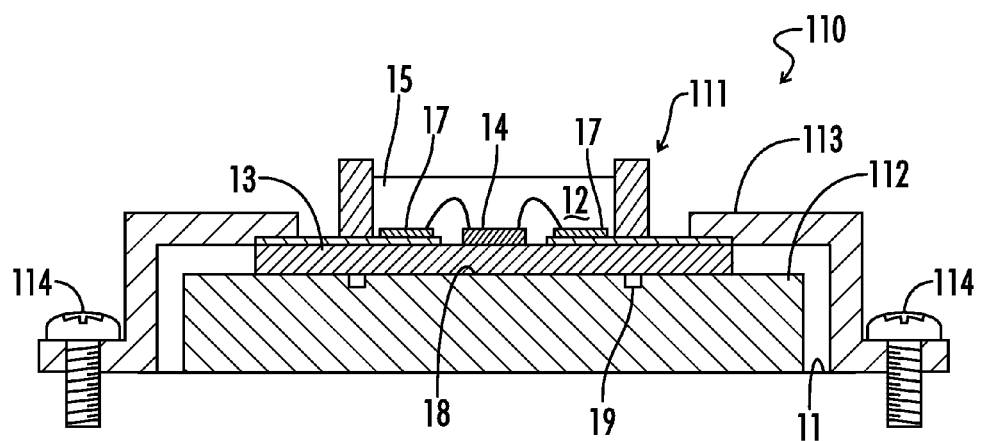
FIG. 12 is a longitudinal sectional view of a lighting structure of a light fixture in accordance with a tenth embodiment of the present invention.
Figure 13:
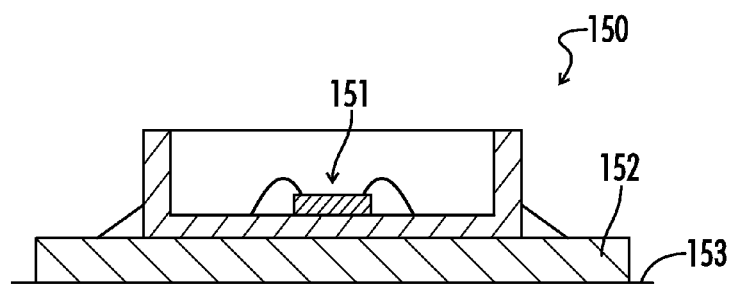
FIG. 13 is a longitudinal sectional view of a prior art lighting structure.
Figure 14:
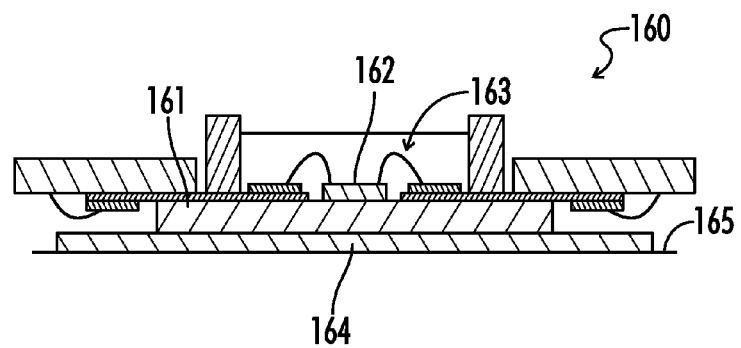
FIG. 14 is a longitudinal sectional view of a prior art lighting structure.

Referring to FIG. 12, a lighting structure or LED module 111 incorporated in a light fixture 110 includes a backing 112 made of alumina ceramics. The structure 111 is fitted to the heat releasing casing 11 by screwing a screw 114 into the heat releasing casing 11 to thereby fix a cover 113, pressing an end part of the metal base material 13 to the heat releasing casing 11.

The structure and the light fixture of the present invention are not limited to the embodiments described above, and thus appropriate modifications and improvements can be made within the scope of the claims.

Thus, although there have been described particular embodiments of the present invention of a new and useful LIGHTING STRUCTURE AND LIGHT FIXTURE it is not intended that such references be construed as limitations upon the scope of this invention except as set forth in the following claims.

What is claimed is:
1. A light fixture comprising
a light emitting diode (LED) package including at least one LED operable to emit light when supplied with a current, said LED package having an outer dimension;
a base to which the LED package is affixed;
a backing having a groove, wherein the groove is continuously formed and an outer dimension of the groove is less than the outer dimension of the LED package;
a fluid between the backing and the base, wherein the fluid is contained between the base, the backing, and an outer edge of the groove of the backing;
a casing functional to dissipate heat generated by the LED package and wherein the backing is affixed to the casing;
LED driver circuitry operable to receive power and provide power to the LED in the LED package; and
wherein a creeping distance between the LED driver circuitry and the casing is at least 1.2 millimeters.

2. The light fixture of claim 1 further comprising:

a fixture main body affixed to the casing;

a reflector affixed to the fixture main body, said reflector operable to receive light emitted by the LED package and reflect the received light in a predetermined direction; and a lens affixed to at least one of the reflector and the fixture main body, wherein light emitted by the LED package passes out of the light fixture via the lens.

3. The light fixture of claim 1 wherein the fluid is at least one of a plastic fluid and an adhesive.

4. The light fixture of claim 1 wherein the fluid comprises heat conducting particles.

5. The light fixture of claim 1 wherein the LED package comprises an LED chip mounted on the base and covered with a sealing material.

6. The light fixture comprising a light emitting diode (LED) package including at least one LED operable to emit light when supplied with a current, said LED package having an outer dimension;

a base to which the LED package is affixed;

a backing having a groove, wherein the groove is continuously formed and an outer dimension of the groove is less than the outer dimension of the LED package; and a fluid between the backing and the base, wherein the fluid is contained between the base, the backing, and an outer edge of the groove of the backing;

wherein the base is metallic; and the backing conducts heat and is an electrical insulator.

7. A method of making a light emitting diode (LED) light fixture, said method comprising:

affixing an LED package to a base, wherein said LED package has an outer dimension;

providing a backing having a groove, wherein said groove is continuously formed, and wherein an outer dimension of the groove is less than the outer dimension of the LED package;

placing a fluid on at least one of the base and the backing;

placing the base on the backing such that the fluid is contained by the base, backing, and an outer edge of the groove in the backing;

wherein the base is metallic;

the backing conducts heat and is an electrical insulator; and the fluid is at least one of a plastic fluid and an adhesive.

8. The method of claim 7 further comprising affixing the backing to a casing, wherein the casing is operable to dissipate heat generated by the LED package.

9. The method of claim 8 wherein a creeping distance between an electric charging unit of the LED package and the casing is at least 1.2 millimeters.

10. The method of claim 8 further comprising:

affixing a fixture main body to the casing;

affixing a reflector to the fixture main body, said reflector operable to receive light emitted by the LED package and reflect the received light in a predetermined direction; and affixing a lens to at least one of the reflector and the fixture main body, wherein light emitted by the LED package passes out of the light fixture via the lens.

11. The method of claim 7 further comprising adding heat conducting particles to the fluid.

* * * * *